(12) United States Patent
Tsuji et al.

(10) Patent No.: US 8,636,498 B2
(45) Date of Patent: Jan. 28, 2014

(54) METHOD FOR MANUFACTURING NANO-IMPRINT MOLD, METHOD FOR FORMING RESIN PATTERN BY NANO-IMPRINT TECHNIQUE, AND NANO-IMPRINT MOLD

(75) Inventors: Yukihiro Tsuji, Yokohama (JP); Masaki Yanagisawa, Yokohama (JP)

(73) Assignee: Sumitomo Electric Industries Ltd, Osaka (JP)

( * ) Notice: Subject to any disclaimer, the term of this patent is extended or adjusted under 35 U.S.C. 154(b) by 347 days.

(21) Appl. No.: 13/204,907

(22) Filed: Aug. 8, 2011

(65) Prior Publication Data
US 2012/0040041 A1 Feb. 16, 2012

(30) Foreign Application Priority Data
Aug. 10, 2010 (JP) ................. 2010-179690

(51) Int. Cl.
*B29C 59/00* (2006.01)
(52) U.S. Cl.
USPC ........ 425/385; 425/174; 425/174.4; 425/403; 425/447; 264/496
(58) Field of Classification Search
USPC ........ 425/174, 174.4, 385, 403, 447; 264/496
See application file for complete search history.

(56) References Cited

U.S. PATENT DOCUMENTS

| 6,943,117 | B2* | 9/2005 | Jeong et al. | 438/694 |
| 7,449,348 | B1* | 11/2008 | Dakshina-Murthy et al. | 438/7 |
| 7,473,090 | B2* | 1/2009 | McMackin et al. | 425/385 |
| 7,654,815 | B2* | 2/2010 | Hasegawa et al. | 425/363 |
| 2002/0115002 | A1* | 8/2002 | Bailey et al. | 430/5 |
| 2004/0209470 | A1* | 10/2004 | Bajorek | 438/689 |
| 2006/0177532 | A1* | 8/2006 | Fletcher et al. | 425/174.4 |
| 2006/0277778 | A1* | 12/2006 | Mick et al. | 33/562 |

FOREIGN PATENT DOCUMENTS

JP 2000-323461 11/2000

OTHER PUBLICATIONS

Kim et al, Trapezoidal Structure for Residue-Free Filling and Patterning, 2007, J. Phys. Chem. C, 111, 1140-1145.*
M. Miller, et al., "Fabrication of nanometer sized features on non-flat substrates using nano-imprint lithography process", Proc. SPIE 5751 994, 2005, pp. 995-998.

* cited by examiner

*Primary Examiner* — Timothy Kennedy
(74) *Attorney, Agent, or Firm* — Smith, Gambrell & Russell, LLP

(57) ABSTRACT

A nano-imprint mold includes a mold body having a first surface provided with a pattern having projections and recesses, a second surface opposite the first surface and a side surface between the first surface and the second surface; and a mold base having a surface for fixing the mold body thereto. In addition, the second surface of the mold body is fixed to a part of the surface of the mold base, the second surface of the mold body being disposed away from at least a part of an edge of the surface of the mold base. Furthermore, the mold body has a shape such that a width thereof in a direction orthogonal to a direction extending from the first surface toward the second surface decreases from the first surface toward the second surface.

9 Claims, 20 Drawing Sheets

METHOD FOR MANUFACTURING NANO-IMPRINT MOLD, METHOD FOR FORMING RESIN PATTERN BY NANO-IMPRINT TECHNIQUE, AND NANO-IMPRINT MOLD

BACKGROUND OF THE INVENTION

1. Field of the Invention

The present invention relates to methods for manufacturing nano-imprint molds, methods for forming resin patterns by a nano-imprint technique, and nano-imprint molds.

2. Description of the Related Art

Japanese Unexamined Patent Application Publication No. 2000-323461 discusses a fine-pattern forming method by a nano-imprint technique. According to this method, a mold used for nano-imprinting is made of an optically transparent material so that a wafer and the mold can be aligned with each other.

"Fabrication of Nanometer Sized Features on Non-Flat Substrates Using a Nano-Imprint Lithography Process", M. Miller, et. al., Proc. SPIE 5751, 994, pp. 995-998 (2005) discusses a fine-processing method using a nano-imprint technique. In this fine-processing method, a step-and-repeat technique is used. The fine-processing method involves preparing a mold having a master transfer pattern, forming a resin portion composed of ultraviolet curing resin on a substrate to be fine-processed, pressing the mold against a predetermined region of the resin portion, curing the resin by irradiation of ultraviolet light, and detaching the mold from the resin layer. This series of steps is sequentially repeated on respective regions of the resin portion. Consequently, the master pattern of the mold is transferred to the resin portion.

SUMMARY OF THE INVENTION

Semiconductor optical devices have fine patterns. In order to manufacture such semiconductor optical devices, the use of a nano-imprint technique is under consideration. An example of a fine pattern in a semiconductor optical device includes a diffraction grating. A diffraction grating is, for example, included in a distributed feedback laser diode. A diffraction grating has periodic projections and recesses with a period of about 200 nm and a depth of about 50 to 300 nm. Using a nano-imprint technique to form such a fine pattern is advantageous in that the manufacturing cost of the device, such as a distributed feedback laser diode, can be reduced.

When a fine pattern of a semiconductor optical device is to be formed by a nano-imprint technique, a semiconductor layer in which the fine pattern is to be formed, and a resin layer are first formed in that order on a semiconductor substrate. The resin layer is composed of, for example, ultraviolet curing resin. At the same time, a mold having a predetermined fine pattern (i.e., projections and recesses) to be formed is prepared. Subsequently, the mold having the predetermined fine pattern is pressed against the resin layer, and the resin layer is cured in that state. When the ultraviolet curing resin is used for the resin layer, the mold made of a material with good ultraviolet transmissivity, such as quartz can be used. The ultraviolet light for curing the resin layer can be emitted to the resin layer through the mold. Then, the mold is detached from the resin layer. Accordingly, the pattern (i.e., projections and recesses) formed in the mold is transferred to the resin layer. This transferring of the pattern formed in the mold to the resin layer is generally performed multiple times while changing the position where the nano-imprint process is to be performed (step-and-repeat technique). Specifically, the semiconductor layer is divided into multiple regions, and the pattern formed in the mold is sequentially transferred to the resin layer on the respective regions.

Subsequently, the semiconductor layer is etched by using the patterned resin layer as a mask. The original pattern including projections and recesses formed in the mold is transferred to the semiconductor layer.

In fine-processing by a nano-imprint technique, the mold used in a step-and-repeat technique preferably has a shape that allows the mold to be pressed only against each of the aforementioned regions of the resin portion. In order to achieve this, the mold used in a step-and-repeat technique has a tabular base and a pattern forming section provided on a surface of the base. A fine pattern is formed on an upper surface of the pattern section that is a pattern surface of the mold.

When a fine pattern is formed on the semiconductor layer by a step-and-repeat technique, it is apparent that the following problems exist.

Specifically, when the pattern surface of the mold is pressed against the resin portion, a part of the resin constituting the resin portion is sometimes extruded outward from a contact area between the mold and the resin portion, thus forming an extruded resin portion. In addition, this extruded resin portion sometimes reaches the mold base via side surfaces of a mold body. If the resin portion becomes cured in this state where the extruded resin portion has reached the mold base, the extruded resin portion also becomes cured, thus forming a burr.

The reason why the extruded resin portion is formed when the pattern surface of the mold is pressed against the resin portion and the reason why the extruded resin portion reaches the mold base via the side surfaces of the mold body are examined. It was found that the angle between the upper surface (i.e., the pattern surface) of the pattern forming section and each side surface of the pattern forming section is a significant factor. Specifically, it was found that the extruded resin portion tends to reach the mold base via the side surfaces of the mold body when the angle between the upper surface and each side surface of the pattern forming section is 90 degrees or larger.

Because the aforementioned burr leads to a reduced yield rate of the finished product (e.g., a distributed feedback laser diode), it is preferable that the burr be removed by etching, such as dry etching. However, it leads to lower productivity to add the process of removing the burr. In addition, the area surrounding the burr (e.g., a diffraction grating layer of the distributed feedback laser diode) can be damaged during this burr removing process. Therefore, a burr formed due to the extruded resin portion leads to lower productivity and lower yield rate of the finished product. Since this removing process is time consuming especially if the burr has a large height, an adverse effect caused by the burr is significant.

In contrast, a nano-imprint mold according to the present invention includes a mold body having a first surface provided with a pattern having projections and recesses, a second surface opposite the first surface and a side surface between the first surface and the second surface; and a mold base having a surface for fixing the mold body thereto. In addition, the second surface of the mold body is fixed to a part of the surface of the mold base, the second surface of the mold body being disposed away from at least a part of an edge of the surface of the mold base. Furthermore, the mold body has a shape such that a width thereof in a direction orthogonal to a direction extending from the first surface toward the second surface decreases from the first surface toward the second surface.

In the nano-imprint mold according to the present invention, the mold body has a shape such that the width thereof in the direction orthogonal to the direction extending from the first surface toward the second surface decreases from the first surface toward the second surface. Moreover, the second surface of the mold body is fixed to the surface of the mold base. Therefore, the interior angle between the side surface and the first surface of the mold body is smaller than 90 degrees.

When a pattern surface formed in the mold body is pressed against a resin portion to form a resin pattern by using the nano-imprint mold, a part of the resin portion is often extruded outward from a contact area between the pattern surface of the mold and the resin portion, thus forming an extruded resin portion. When the nano-imprint mold according to the present invention is used to form the resin pattern, the extruded resin portion can be prevented from reaching the surface of the mold base via the side surface of the mold body. Accordingly, an area of the surface of the mold base on which the mold body is not fixed is maintained in contact with the atmosphere around the nano-imprint mold.

Therefore, for example, when ultraviolet light is emitted toward the resin portion from above the nano-imprint mold so as to cure the resin while the first surface of the mold body is pressed against the resin portion, the ultraviolet light is reflected at the interface between the atmosphere and the surface of the mold base on which the mold body is not fixed. Accordingly, the amount of ultraviolet light received by the extruded resin portion is minimized. This can prevent the extruded resin portion from being cured. Specifically, the occurrence of a burr resulting from the extruded resin portion can be minimized. Even if a burr is formed, the height thereof can be reduced. By using the nano-imprint mold according to the present invention to form a resin pattern, an adverse effect caused by a burr formed in transferring a pattern to the resin portion can be minimized.

Furthermore, in the nano-imprint mold according to the present invention, the mold body preferably has an interior angle between the side surface and the first surface of the mold body larger than or equal to 40 degrees and smaller than 90 degrees. More preferably, the mold body has an interior angle between the side surface and the first surface of the mold body of 75 degrees to 80 degrees. When the interior angle is smaller than 90 degrees, more preferably, 80 degrees or smaller, the extruded resin portion can be sufficiently prevented from reaching the surface of the mold base via the side surface of the mold body when the first surface of the mold body is pressed against the resin portion. As a result, an adverse effect caused by a burr formed in transferring a pattern to the resin portion can be further minimized. When the interior angle is 40 degrees or larger, more preferably, 75 degrees or larger, the strength of each corner that defines the interior angle of the mold body can be sufficiently increased.

Furthermore, in the nano-imprint mold according to the present invention, the mold base may have a first base section and a second base section that is provided on a part of a surface of the first base section, the second base section extending along at least a part of an edge of the surface of the first base section. The second surface of the mold body is fixed to the surface of the first base section. In addition, the mold body is disposed away from the second base section. Furthermore, the second base section has a height from the surface of the first base section smaller than a distance from the surface of the first base section to the first surface of the mold body.

Since the height of the second base section from the surface of the first base section may be smaller than the distance from the surface of the first base section to the first surface of the mold body, the second base section does not become a hindrance to the pressing of the first surface of the mold body against the resin portion. Furthermore, the second base section protects the mold body 5 from being damaged by coming into contact with other members.

Furthermore, in the nano-imprint mold according to the present invention, the second base section is preferably provided entirely along the edge of the surface of the first base section. And, the first base section and the second base section may define a recess.

Furthermore, it is preferable that the nano-imprint mold according to the present invention further include a hydrophobic film on the first surface of the mold body. More preferably, the hydrophobic film is formed on the first surface and the side surface of the mold body. Accordingly, when the first surface of the mold body is pressed against the resin portion, the extruded resin portion is less movable along the side surface of the mold body toward the surface of the mold base. Therefore, the extruded resin portion can be further prevented from reaching the surface of the mold base. As a result, an adverse effect caused by a burr formed in transferring a pattern to the resin portion can be further minimized.

Furthermore, in the nano-imprint mold according to the present invention, the hydrophobic film is preferably composed of hexamethyldisilazane. Moreover, the mold body and the mold base may be composed of an ultraviolet transmissible material.

Furthermore, in the nano-imprint mold according to the present invention, the pattern in the first surface of the mold body may be a diffraction grating pattern having periodic projections and recesses.

DESCRIPTION OF THE PREFERRED EMBODIMENTS

Figure 1:
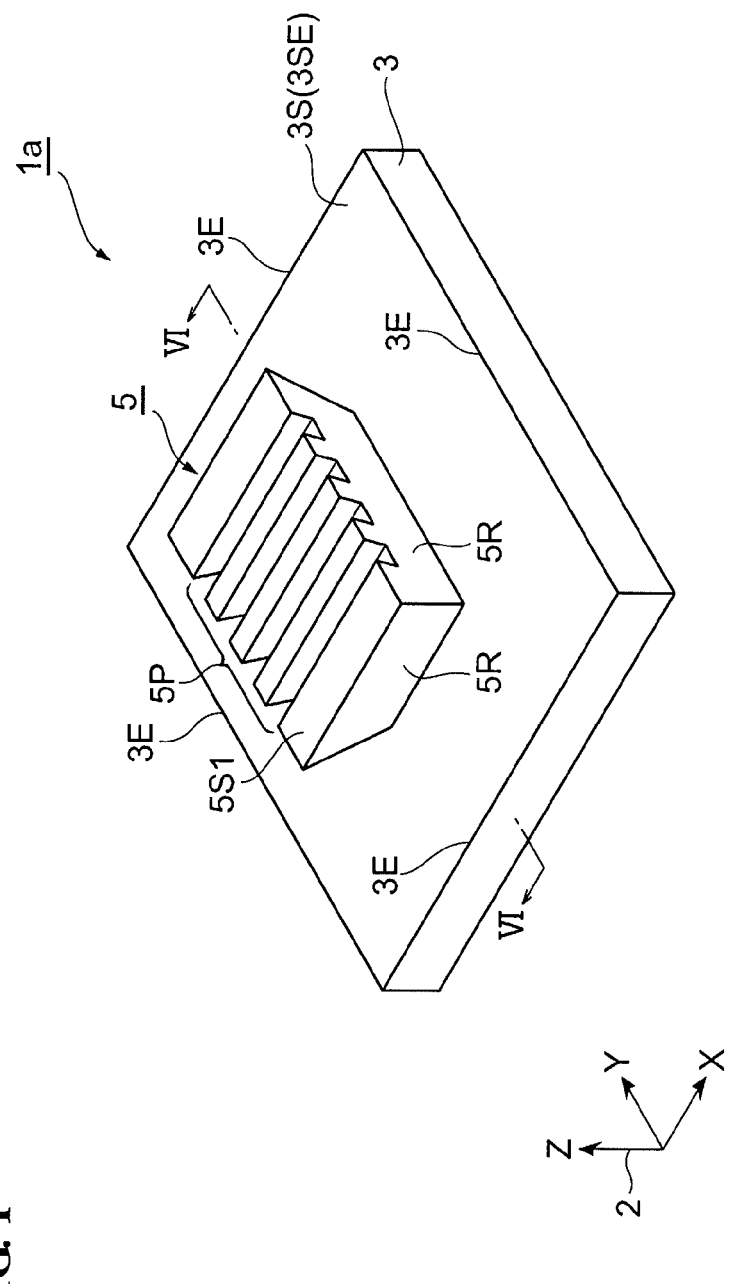
FIG. 1 is a perspective view of a nano-imprint mold according to a first embodiment.

A nano-imprint mold, a method for manufacturing a nano-imprint mold, and a method for forming a resin pattern by a nano-imprint technique according to embodiments will be described below with reference to the attached drawings. In each of the drawings, the same reference numerals or characters are used for the same components, where possible. Moreover, the dimensional ratios within and between the components are set to arbitrary values for easier understanding of the drawings.

First Embodiment

Figure 2:
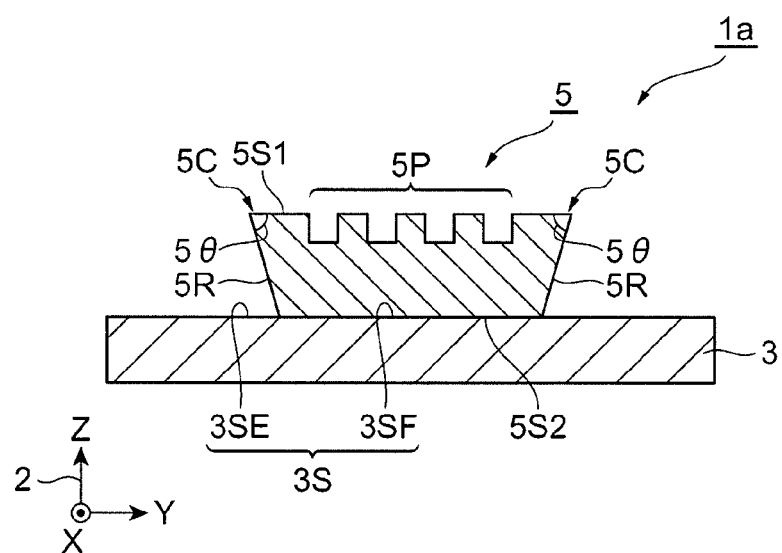
FIG. 2 is a cross-sectional view of the nano-imprint mold taken along line VI-VI in FIG. 1.

First, a nano-imprint mold according to a first embodiment will be described. FIG. 1 is a perspective view of a nano-imprint mold 1a according to the first embodiment. FIG. 2 is a cross-sectional view of the nano-imprint mold 1a taken along line VI-VI in FIG. 1. In FIGS. 1, 2, and onward, an orthogonal coordinate system 2 is shown.

As shown in FIG. 1, the nano-imprint mold 1a according to this embodiment includes a mold base 3 and a mold body 5. A second surface 5S2 of the mold body 5 is fixed to a part of a surface 3S of the mold base 3 by a fixer, such as an adhesive. The second surface 5S2 of the mold body 5 is disposed away from edges 3E of the surface 3S of the mold base 3. In this embodiment, the second surface 5S2 of the mold body 5 is disposed away from all of the edges 3E of the surface 3S of the mold base 3. Alternatively, a structure in which the second surface 5S2 is disposed away from at least a part of the edges 3E of the surface 3S of the mold base 3 is also permissible. Furthermore, the mold base 3 and the mold body 5 may be integrated with each other. In that case, the mold base 3 and the mold body 5 are composed of the same material.

The surface 3S of the mold base 3 of the nano-imprint mold 1a according to this embodiment has a fixation surface 3SF on which the mold body 5 is fixed and a non-fixation surface 3SE on which the mold body 5 is not fixed.

Figure 3:
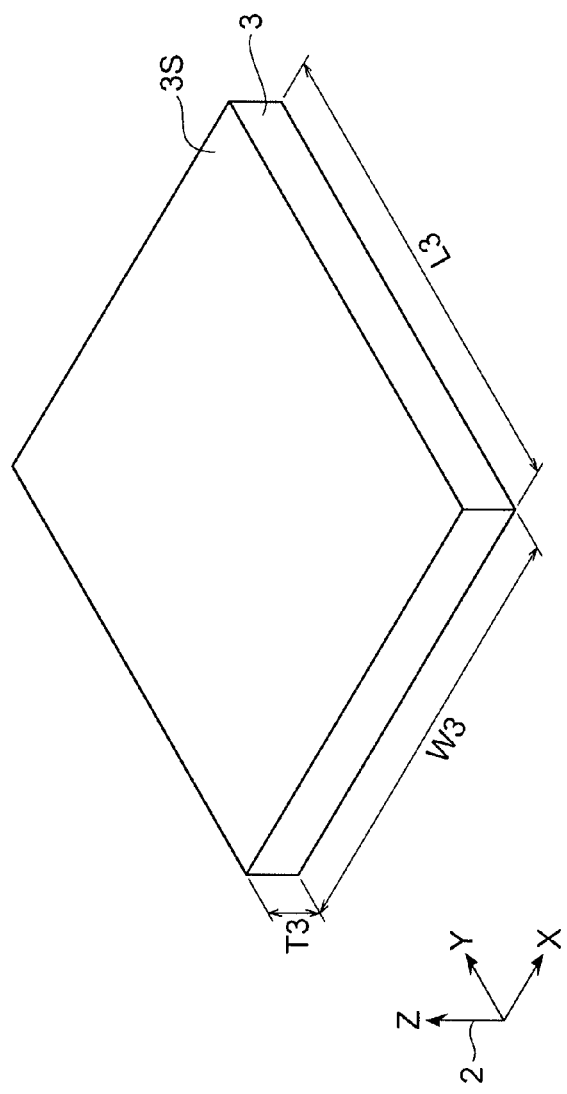
FIG. 3 is a perspective view of a mold base of the nano-imprint mold according to the first embodiment.

Next, the configuration of the mold base 3 will be described. FIG. 3 is a perspective view of the mold base 3. The mold base 3 has the surface 3S for fixing the mold body 5 thereon. In this embodiment, the surface 3S is a flat surface. More specifically, the mold base 3 is composed of a rectangular-shaped plate. Its thickness direction corresponds to a direction of a Z axis. In addition, the mold base 3 has the surface 3S extending along an X-Y plane. The surface 3S has outer edges extending along the X axis and outer edges extending along the Y axis.

The mold base 3 is composed of a material that can transmit ultraviolet light to be emitted to a resin portion to cure the resin portion in a curing step, to be described later. For example, the mold base 3 is composed of a material with a transmittance of 90% relative to ultraviolet light with a wavelength of 365 nm. The mold base 3 is made of, for example, quartz or synthetic quartz.

The mold base 3 has a thickness T3 in the Z-axis direction of, for example, 0.6 mm to 10 mm. The mold base 3 has a width W3 in the X-axis direction of, for example, 60 mm to 150 mm. The mold base 3 has a length L3 in the Y-axis direction of, for example, 60 mm to 150 mm. However, these dimensions of the mold base 3 are not particularly limited to these values.

Figure 4:
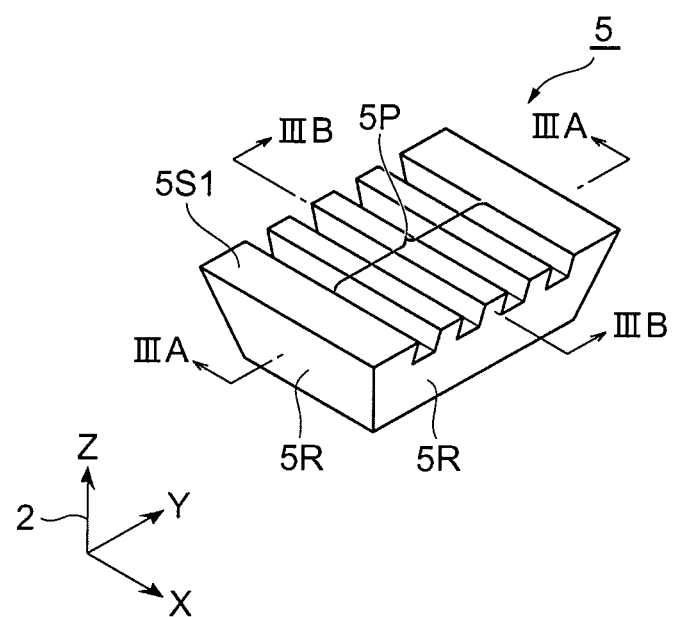
FIG. 4 is a perspective view of a mold body of the nano-imprint mold according to the first embodiment.
Figure 5A:
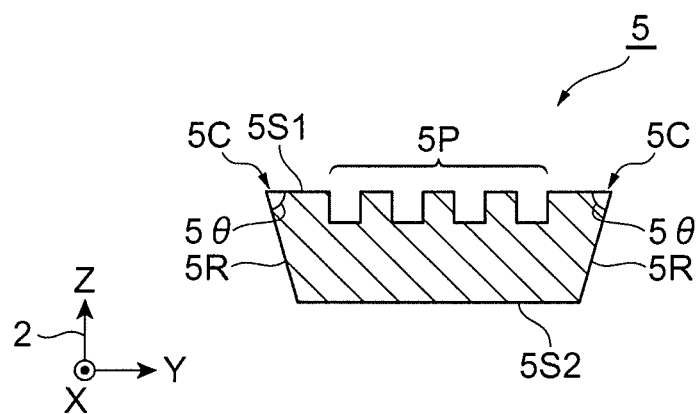
FIG. 5A is a cross-sectional view of the mold body taken along line IIIA-IIIA in FIG. 4.
Figure 5B:
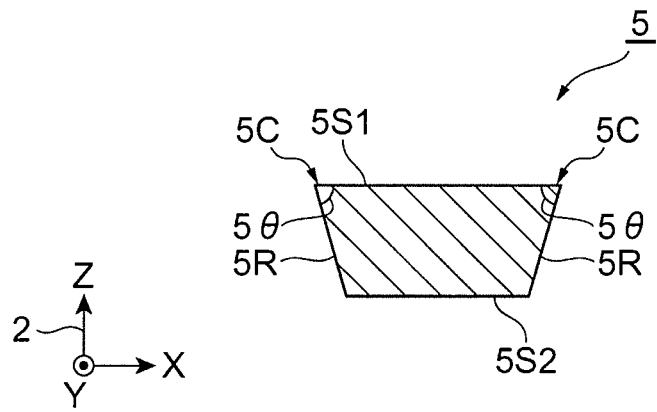
FIG. 5B is a cross-sectional view of the mold body taken along line IIIB-IIIB in FIG. 4.

Next, the configuration of the mold body 5 will be described. FIG. 4 is a perspective view of the mold body 5. FIG. 5A is a cross-sectional view of the mold body 5 taken along line IIIA-IIIA in FIG. 4. FIG. 5B is a cross-sectional view of the mold body 5 taken along line IIIB-IIIB in FIG. 2.

As shown in FIGS. 4, 5A, and 5B, the mold body 5 in this embodiment is composed of a rectangular-shaped plate. Its thickness direction corresponds to the Z axis. The mold body has a first surface 5S1 and the second surface 5S2 that extend along the X-Y plane. The second surface 5S2 is a surface opposite to the first surface 5S1. The first surface 5S1 and the second surface 5S2 each have outer edges extending along the X axis and outer edges extending along the Y axis.

The first surface 5S1 is provided with a nano-imprint pattern 5P. In this embodiment, the pattern 5P is used for forming a diffraction grating included in a distributed feedback laser diode (DFB laser diode) or the like. Specifically, the pattern 5P in this embodiment has a plurality of line segments extending along the X axis. The line segments have the same width in the Y-axis direction and the same height in the Z-axis direction. In addition, the pattern 5P in this embodiment has a plurality of space segments extending along the X axis. The space segments have the same width in the Y-axis direction and the same height in the Z-axis direction. The pattern 5P is a line-and-space pattern in which the line segments and the space segments are alternately arranged in the Y-axis direction.

Each of the line segments and the space segments has a height in the Z-axis direction of, for example, 50 nm to 300 nm. Each of the line segments and the space segments has a width in the Y-axis direction of, for example, 50 nm to 300 nm. The pattern 5P has a period in the Y-axis direction of, for example, 200 nm and 250 nm. The period of the pattern 5P corresponds to the sum of the width of one line segment in the Y-axis direction and the width of one space segment in the Y-axis direction.

The mold body 5 is composed of a material that can transmit ultraviolet light to be emitted to the resin portion to cure the resin portion in a curing step of a resin-pattern forming method, to be described later. For example, the mold body 5 is composed of a material with a transmittance of 90% relative to ultraviolet light with a wavelength of 365 nm. The mold body 5 is made of, for example, quartz or synthetic quartz. The material used for forming the mold body 5 may be the same as or different from that of the mold base 3.

As shown in FIGS. 5A and 5B, the mold body 5 has a shape such that the widths thereof in directions orthogonal to the direction extending from the first surface 5S1 toward the second surface 5S2 decrease from the first surface 5S1 toward the second surface 5S2. The direction extending from the first surface 5S1 toward the second surface 5S2 corresponds to the Z-axis direction, and the direction orthogonal to the direction extending from the first surface 5S1 toward the second surface 5S2 corresponds to the X-axis direction or the Y-axis direction. Therefore, an interior angle 5θ between each side surface 5R and the first surface 5S1 of the mold body 5 is smaller than 90 degrees. Each side surface 5R and the first surface 5S1 of the mold body 5 define a corner 5C.

The first surface 5S1 of the mold body 5 has a length in the X-axis direction of, for example, 5 mm to 25 mm. The first surface 5S1 has a length in the Y-axis direction of, for example, 5 mm to 25 mm. The second surface 5S2 of the mold body 5 has a length in the X-axis direction of, for example, 5 mm to 25 mm. The second surface 5S2 has a length in the Y-axis direction of, for example, 5 mm to 25 mm. The mold body 5 has a thickness in the Z-axis direction of, for example, 0.5 mm to 1 mm. The surface area of each of the first surface 5S1 and the second surface 5S2 of the mold body 5 is smaller than that of the surface 3S of the mold base 3.

Figure 6:
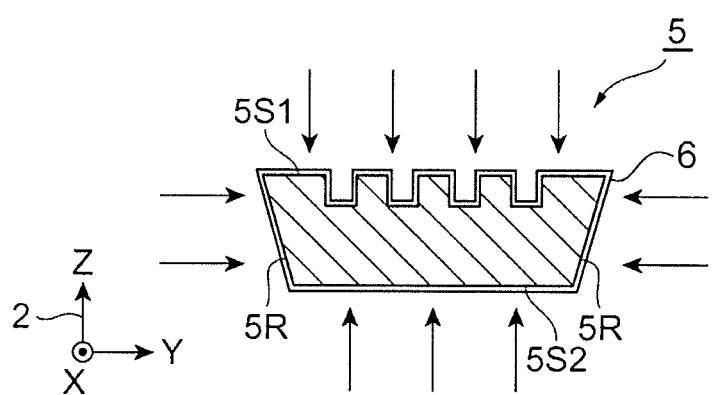
FIG. 6 is a cross-sectional view of the mold body for explaining a hydrophobic film formed on a surface of the nano-imprint mold according to the first embodiment and for explaining a surface treatment step for forming the hydrophobic film.

Referring to FIG. 6, at least the first surface 5S1 of the mold body 5 is provided with a hydrophobic film 6 made of, for example, hexamethyldisilazane (HMDS). The hydrophobic film 6 improves the wetting characteristics of the surface of the mold body 5 with respect to a resin portion 17 (see FIGS. 9 to 13) to be used for forming a resin pattern, to be described later. This hydrophobic film 6 has a thickness of, for example, 1 nm to 5 nm. The hydrophobic film 6 may be formed only over the first surface 5S1 of the mold body 5, or may be formed entirely or partially on the second surface 5S2 and the side surfaces 5R, in addition to the first surface 5S1.

Next, a method for manufacturing a nano-imprint mold according to the first embodiment will be described. The method for manufacturing a nano-imprint mold according to this embodiment includes a mold-base preparation step, a mold-body preparation step, a surface treatment step, and a fixing step.

Mold-Base Preparation Step

In this step, the mold base 3 shown in FIG. 3 is prepared. The mold base 3 has the surface 3S for fixing the mold body 5 thereon. The mold base 3 can be obtained by, for example, cutting a plate-like substrate, which is composed of a material used for forming the mold base 3, into a predetermined shape by using a cutter such as a dicing cutter and a dicing saw.

Mold-Body Preparation Step

In this step, the mold body 5 shown in FIGS. 4, 5A, and 5B is prepared. The first surface 5S1 of the mold body 5 is provided with the nano-imprint pattern 5P. The widths of the mold body 5 in directions orthogonal to the direction extending from the first surface 5S1 toward the second surface 5S2 (that is, widths in the X-axis and Y-axis directions) decrease from the first surface 5S1 toward the second surface 5S2. Therefore, the interior angle 5θ between each side surface 5R and the first surface 5S1 of the mold body 5 is smaller than 90 degrees.

In order to form the mold body 5 having such a shape, for example, a plate-like substrate is prepared. Then, a pattern of projections and recesses, which is to become the pattern 5P of, for example, a diffraction grating, is formed in a surface of the substrate. The forming process of the pattern 5P involves first forming a resist on a surface (pattern surface) of the mold body 5. Then, the pattern 5P is formed in the resist by, for example, an EB exposure technique. Subsequently, the pattern surface of the mold body 5 is etched by, for example, reactive ion etching (RIE) using the resist having the pattern formed therein as a mask. As a result, the pattern 5P is transferred to the surface of the substrate, whereby the pattern 5P of projections and recesses is formed.

Next, the substrate is cut into a predetermined shape by using a cutter such as a dicing cutter and a dicing saw, thereby obtaining the mold body 5. In order to set the interior angle 5θ between each side surface 5R and the first surface 5S1 of the mold body 5 to be smaller than 90 degrees, the cutter used for cutting the substrate may be a cutting unit having a cutting blade with a V-shape that corresponds to the interior angle 5θ.

Surface Treatment Step

FIG. 6 is a cross-sectional view of the mold body 5 for explaining the surface treatment step. In this step, at least the first surface 5S1 of the mold body 5 is surface-treated for improving the wetting characteristics of the surface of the mold body 5 with respect to the resin portion 17 (see FIGS. 9 to 13) to be used for forming a resin pattern, to be described later.

This surface treatment is performed on the first surface 5S1 and the side surfaces 5R of the mold body 5. In addition to the first surface 5S1 and the side surfaces 5R, the surface treatment may be performed entirely or partially on the second surface 5S2.

The surface treatment includes a hydrophobic treatment and a dehydration treatment. The hydrophobic treatment includes a process of, for example, applying a liquid agent having a hydrophobic function, such as hexamethyldisilazane (HMDS), to the surface of the object by spin coating. A process of soaking the object into the liquid agent or a process of vaporizing the agent and exposing the object to the vapor may be included for the hydrophobic treatment. As a result, the hydrophobic film 6 made of, for example, hexamethyldisilazane (HMDS), is formed on the first surface 5S1 as well as the side surfaces 5R of the mold body 5, as shown in FIG. 6. The hydrophobic film 6 has a thickness of, for example, 1 nm to 5 nm.

The dehydration treatment can be similarly performed by, for example, using a liquid agent having a dehydrating function, such as isopropyl alcohol (IPA). Specifically, the dehydration treatment includes a process of applying the aforementioned liquid agent to the surface of the object by spin coating. A process of soaking the object into the liquid agent and then drying the object or a process of vaporizing the agent and exposing the object to the vapor may be included for the dehydration treatment.

The surface treatment step may be performed after the fixing step mentioned above. Moreover, the surface treatment step may be omitted.

Fixing Step

In this step, the second surface 5S2 of the mold body 5 is fixed to a part of the surface 3S of the mold base 3 by using, for example, a fixer, such as an adhesive, as shown in FIGS. 1 and 2. In this case, the second surface 5S2 of the mold body 5 is disposed away from the edges 3E of the surface 3S of the mold base 3. In this embodiment, the second surface 5S2 of the mold body 5 is disposed away from all of the edges 3E of the surface 3S of the mold base 3. Alternatively, a structure in which the second surface 5S2 is disposed away from at least a part of the edges 3E of the surface 3S of the mold base 3 is also permissible.

As a result of these steps, the nano-imprint mold 1a according to this embodiment is obtained.

Next, a method for forming a resin pattern using the nano-imprint mold 1a according to this embodiment will be described. The resin-pattern forming method in this embodiment includes a resin-portion forming step, a pressing step, a curing step, and a detaching step.

FIGS. 7 and 9 to 15 are cross-sectional views for explaining the resin-pattern forming method according to this embodiment. FIG. 8 is a plan view for explaining the resin-pattern forming method according to this embodiment.

Resin-Portion Forming Step

Figure 7:
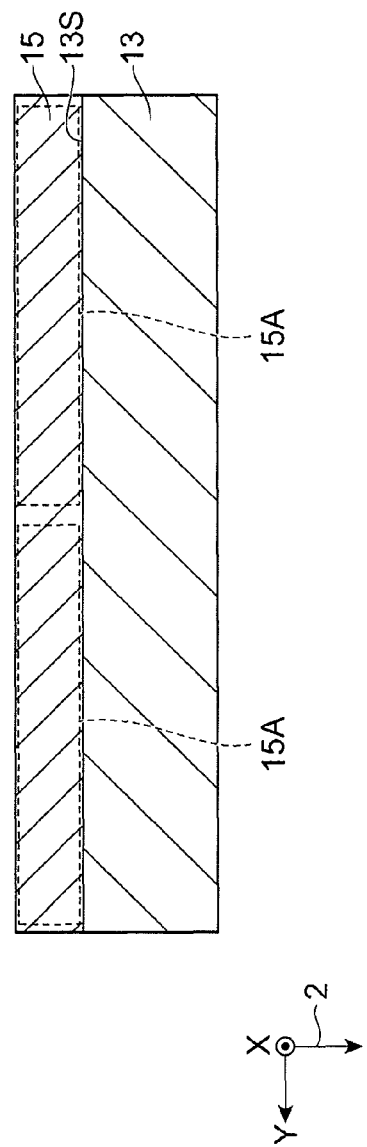
FIG. 7 is a cross-sectional view for explaining a resist-pattern forming method according to the first embodiment.
Figure 8:
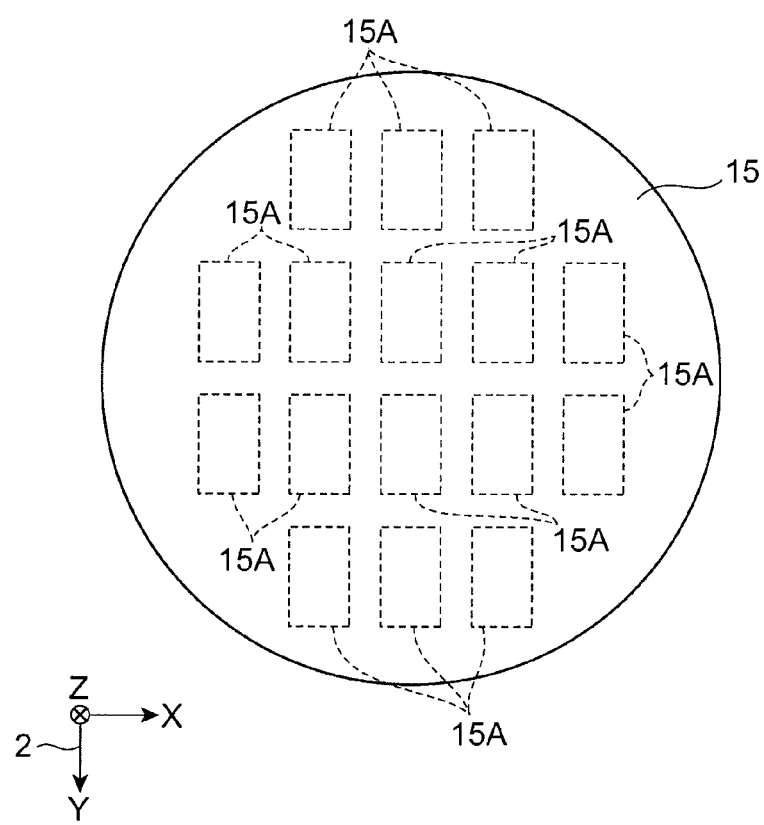
FIG. 8 is a plan view for explaining the resist-pattern forming method according to the first embodiment.

First, referring to FIG. 7, in the resin-portion forming step, a semiconductor substrate 13 is prepared. The semiconductor substrate 13 is composed of, for example, a group IV semiconductor such as silicon (Si) or germanium (Ge), or a group III-V compound semiconductor such as gallium arsenide (GaAs) or indium phosphide (InP). Referring to FIGS. 7 and 8, a semiconductor layer 15 is formed on a surface 13S of the semiconductor substrate 13. The semiconductor layer 15 is divided into a plurality of regions 15A. In a subsequent process, the mold 1a sequentially transfers patterns to the resin portion 17 on the respective regions 15A (step-and-repeat technique).

Subsequently, referring to FIG. 9, the resin portion 17 composed of ultraviolet curing resin is formed on a surface 15s of the semiconductor layer 15. The resin portion 17 is formed by applying a resinous liquid containing ultraviolet curing resin onto the surface 15S of the semiconductor layer 15 by a falling-drop method or a spin coating method. Then, the resinous liquid is heated to a predetermined temperature, thereby forming the resin portion 17. The resin portion 17 formed on the surface 15S of the semiconductor layer 15 has fluidity in the state shown in FIG. 9.

Figure 9:
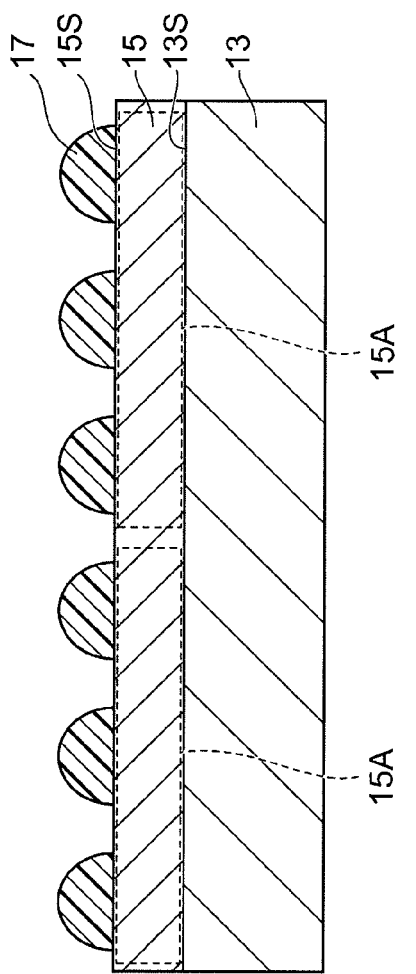
FIG. 9 is another cross-sectional view for explaining the resist-pattern forming method according to the first embodiment.

As shown in FIG. 9, the resin portion 17 may be distributed over the surface 15S of the semiconductor layer 15. The resin portion 17 is divided into multiple parts. However, a layer of the resin portion 17 may be provided on the entire surface 15S of the semiconductor layer 15. Furthermore, an adhesive layer so as to enhance the adhesiveness between the semiconductor layer 15 and the resin portion 17 may be interposed between the semiconductor layer 15 and the resin portion 17.

Pressing Step

Figure 10:
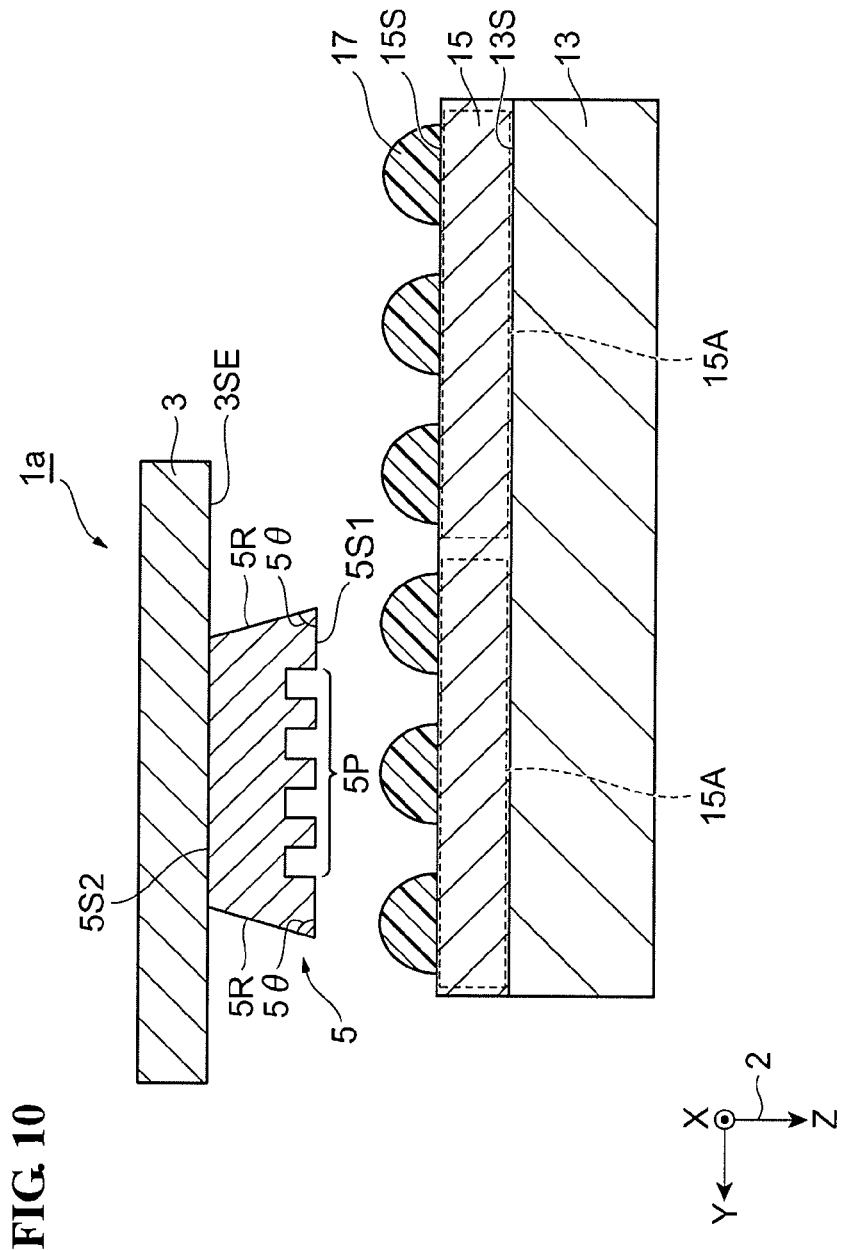
FIG. 10 is another cross-sectional view for explaining the resist-pattern forming method according to the first embodiment.

Subsequently, referring to FIG. 10, the above-described nano-imprint mold 1a according to this embodiment is prepared. The surface 15s of one of the regions 15A of the semiconductor layer 15 is brought to face the first surface 5S1 of the mold 1a. In this case, the surface 15s of the semiconductor layer 15 and the first surface 5S1 of the mold body 5 are set substantially parallel to each other.

Figure 11:
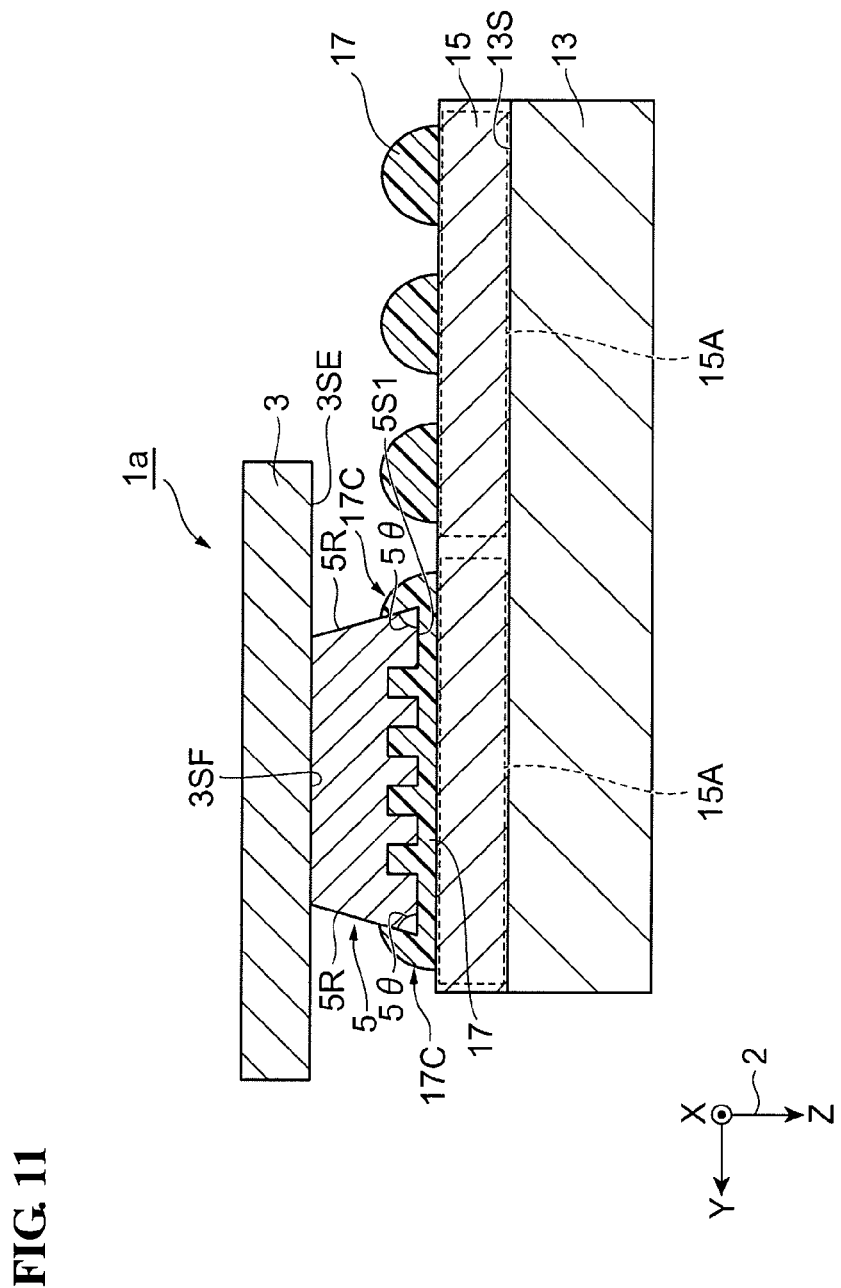
FIG. 11 is another cross-sectional view for explaining the resist-pattern forming method according to the first embodiment.

Then, referring to FIG. 11, the mold 1a is moved in the Z-axis positive direction so that the first surface 5S1 of the mold body 5 comes into contact with a surface of the resin portion 17 on the aforementioned region 15A. Then, the first surface 5S1 of the mold body 5 is pressed against the resin portion 17 on the aforementioned region 15A. This can sometimes cause a part of the resin portion 17 to be extruded outward from a contact area between the first surface 5S1 and the resin portion 17. This extruded part of the resin portion 17 becomes an extruded resin portion 17C. The extruded resin portion 17C can sometimes become attached to the side surfaces 5R of the mold body 5. However, because the interior angle 5θ between the first surface 5S1 and each side surface 5R is smaller than 90 degrees, as described above, the extruded resin portion 17C is prevented from reaching the non-fixation surface 3SE of the mold base 3 via the side surfaces 5R.

Curing Step

Figure 12:
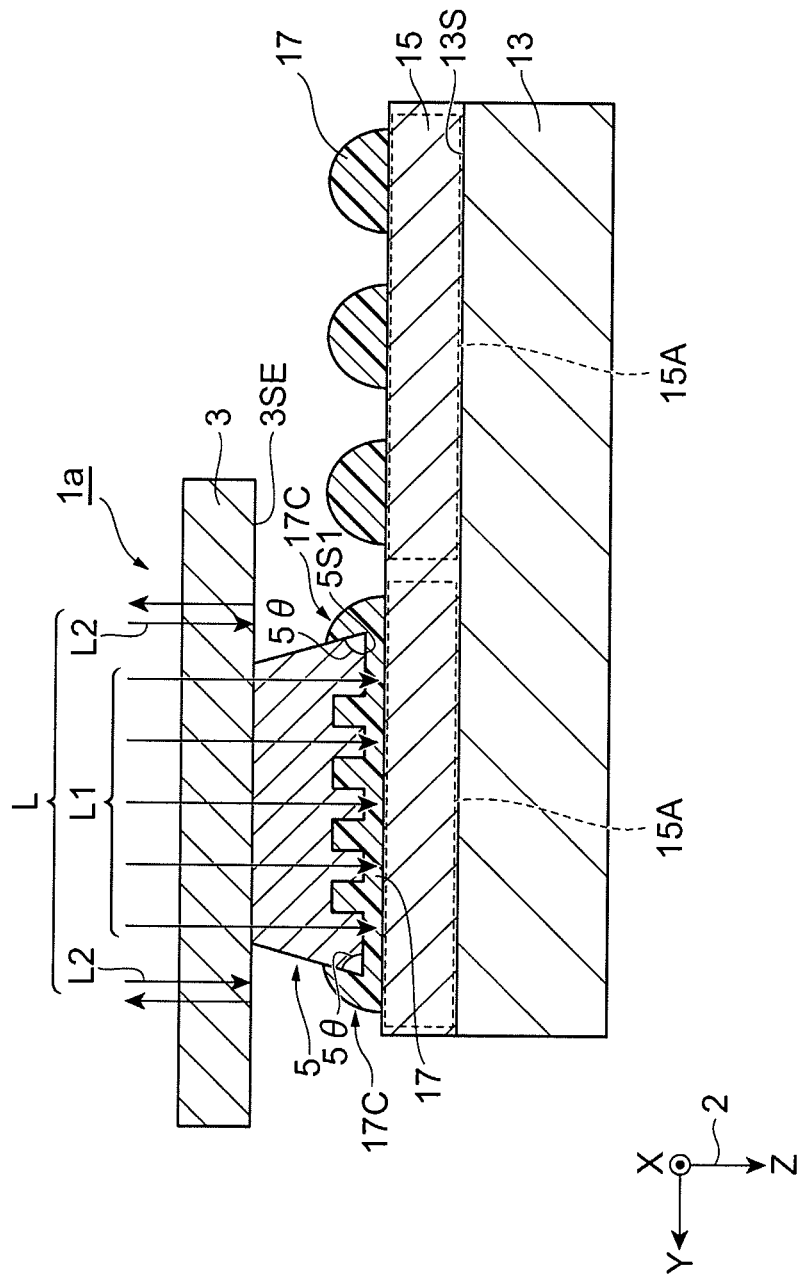
FIG. 12 is another cross-sectional view for explaining the resist-pattern forming method according to the first embodiment.

Subsequently, referring to FIG. 12, ultraviolet light L is emitted to the resin portion 17 on the aforementioned region 15A while the first surface 5S1 of the mold 1a is pressed against the resin portion 17. With the emission of the ultraviolet light L, the resin portion 17 is cured. In this case, the ultraviolet light L is emitted from the mold base 3 side of the mold 1a and is transmitted through the mold 1a so as to reach the resin portion 17 on the aforementioned region 15A.

The emitted ultraviolet light L may have a wavelength ranging between, for example, 310 nm and 400 nm.

Of the ultraviolet light L, a major portion of an ultraviolet component L1 reaching the first surface 5S1 of the mold body 5 is transmitted through the first surface 5S1 and reaches the resin portion 17 because a difference in refractive indices between the mold body 5 and the resin portion 17 relative to the ultraviolet light L is small. In contrast, of the ultraviolet light L, a major portion of an ultraviolet component L2 reaching the non-fixation surface 3SE of the mold base 3 is reflected at the interface between the non-fixation surface 3SE and the atmosphere around the mold 1a (e.g., air atmosphere, nitrogen atmosphere, vacuum atmosphere, etc.) because a difference in refractive indices between the mold base 3 and the atmosphere relative to the ultraviolet light L is large. When the ultraviolet light is emitted to the extruded resin portion 17C, the extruded resin portion 17C can sometimes become a burr. However, as mentioned above, the major portion of the ultraviolet component L2 is reflected at the interface between the non-fixation surface 3SE and the atmosphere. Therefore, the occurrence of a burr resulting from the extruded resin portion 17C can be minimized.

Detaching Step

Figure 13:
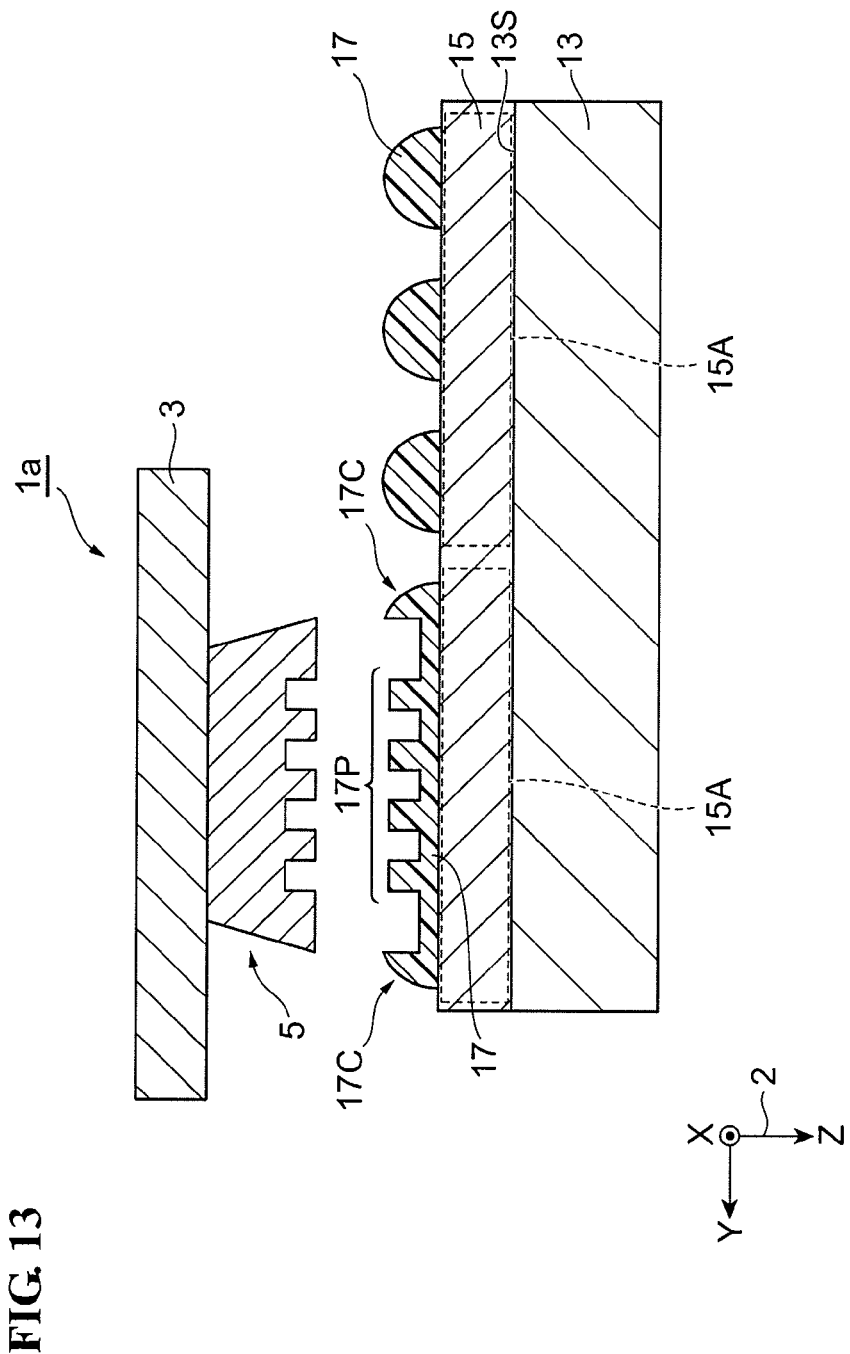
FIG. 13 is another cross-sectional view for explaining the resist-pattern forming method according to the first embodiment.

Subsequently, referring to FIG. 13, the mold 1a is detached from the resin portion 17 on the aforementioned region 15A. Accordingly, a resin pattern 17P is formed in the resin portion 17.

Repeating Step

Figure 14:
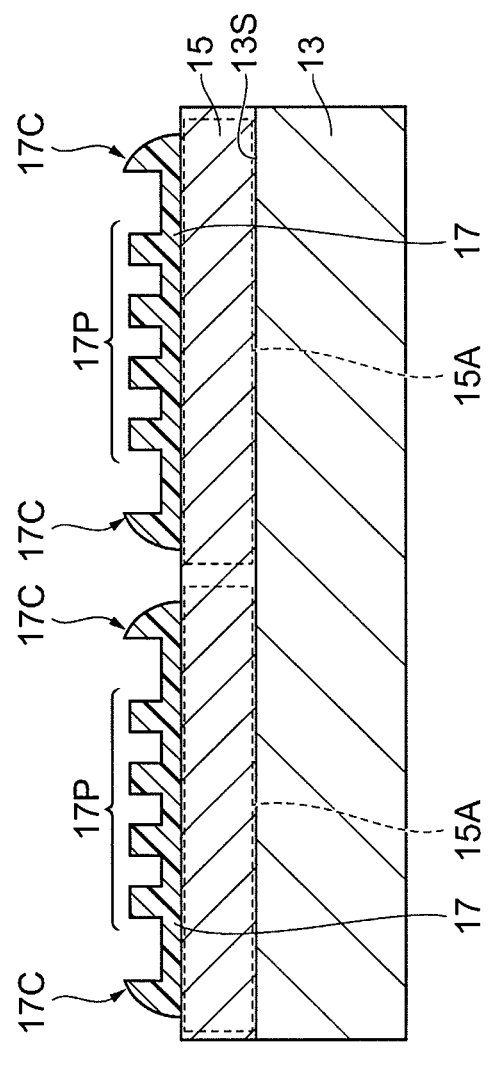
FIG. 14 is another cross-sectional view for explaining the resist-pattern forming method according to the first embodiment.

The above-described series of steps (i.e., the resin-portion forming step, the pressing step, the curing step, and the detaching step) is sequentially performed for the resin portion 17 on other regions 15A of the semiconductor layer 15. Accordingly, resin patterns 17P are formed in the resin portion 17 on all of the regions 15A of the semiconductor layer 15, as shown in FIG. 14. Each of the resin patterns 17P is a pattern having the pattern 5P in the first surface 5S1 of the mold body 5 transferred thereto.

Figure 15:
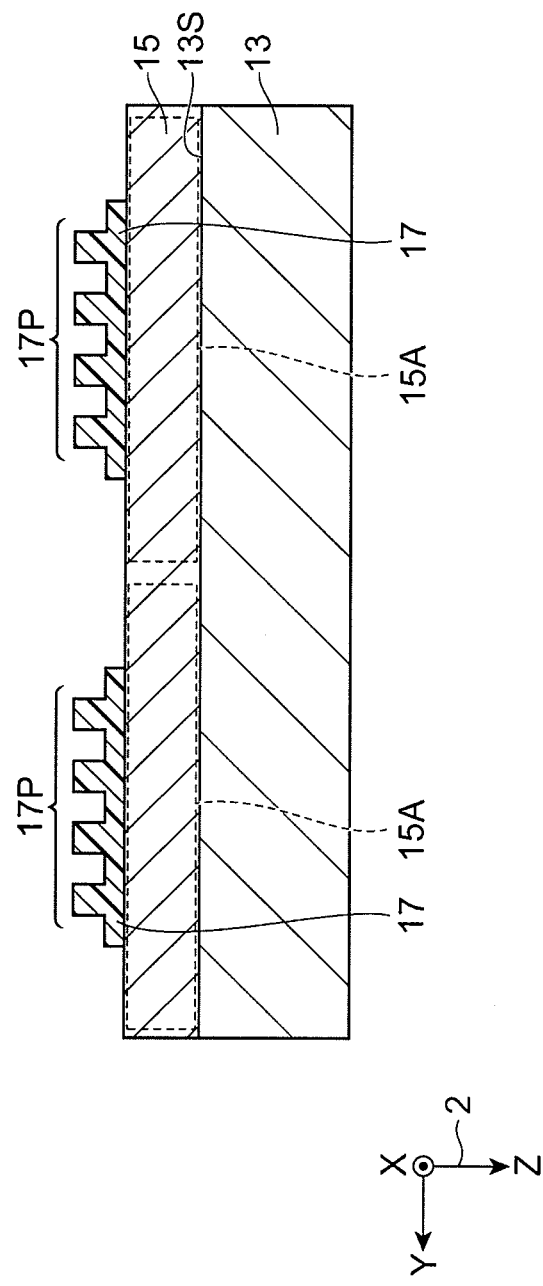
FIG. 15 is another cross-sectional view for explaining the resist-pattern forming method according to the first embodiment.

Referring to FIG. 15, after the repeating step, the extruded resin portion 17C in an uncured state is preferably removed by using an organic solution or the like, such as isopropyl alcohol. If a burr is formed as a result of partially or entirely curing the extruded resin portion 17C in the curing step, the burr composed of the resin is preferably removed by an ashing process or the like.

By using the resin patterns 17P formed in this manner, fine patterns are formed in the semiconductor layer 15. A process for forming the fine patterns in the semiconductor layer 15 by using the resin patterns 17P will be described below.

Figure 16:
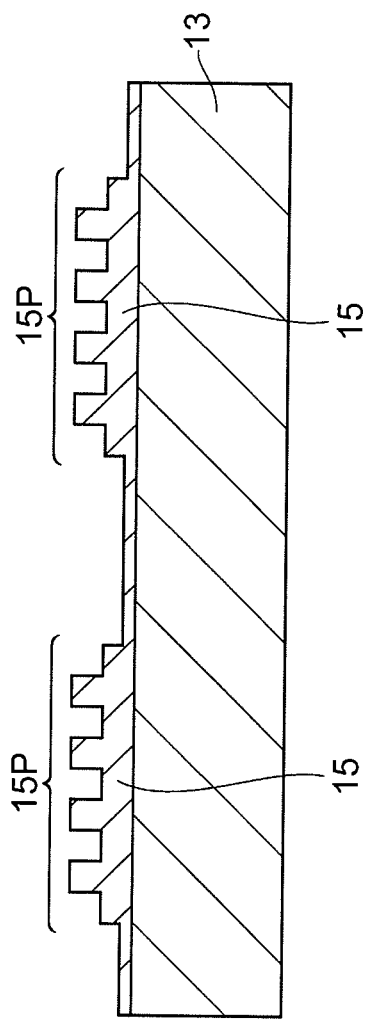
FIG. 16 is a cross-sectional view of a semiconductor layer having fine patterns formed therein.

For example, the resin portion 17 with the resin patterns 17P formed therein and a part of the semiconductor layer 15 are etched by, for example, dry etching, such as reactive ion etching. In each resin pattern 17P, an area with a thinner residual film than other areas is etched deeper so that the surface 15S of the semiconductor layer 15 directly below this area becomes exposed faster. Therefore, as shown in FIG. 16, the resin patterns 17P can be transferred to the semiconductor layer 15. FIG. 16 is a cross-sectional view of the semiconductor layer 15 having the fine patterns formed therein. Accordingly, diffraction gratings 15P can be formed as fine patterns in the semiconductor layer 15.

In the nano-imprint mold 1a according to this embodiment described above, the mold body 5 has a shape such that the widths thereof in directions orthogonal to the direction extending from the first surface 5S1 toward the second surface 5S2 (i.e., the widths in the X-axis and Y-axis directions)

decrease from the first surface 5S1 toward the second surface 5S2. Moreover, the interior angle 5θ between each side surface 5R and the first surface 5S1 of the mold body 5 is smaller than 90 degrees.

When the first surface 5S1 of the mold body 5 of the nano-imprint mold 1a according to this embodiment is pressed against the resin portion 17, a part of the resin portion 17 is often extruded outward from the contact area between the first surface 5S1 and the resin portion 17, thus forming the extruded resin portion 17C. Even in this case, the extruded resin portion 17C can be prevented from reaching the non-fixation surface 3SE of the mold base 3 via the side surfaces 5R of the mold body 5. Accordingly, the non-fixation surface 3SE in the surface 3S of the mold base 3 is maintained in contact with the atmosphere around the mold 1a.

Therefore, when the ultraviolet light L is emitted toward the resin portion 17 from above the mold 1a while the first surface 5S1 of the mold body 5 is pressed against the resin portion 17, the ultraviolet light L is readily reflected at the interface between the non-fixation surface 3SE and the atmosphere around the mold 1a.

Accordingly, the amount of the ultraviolet component L2 received by the extruded resin portion 17C is minimized. This can prevent the extruded resin portion 17C from being cured. Therefore, the occurrence of a burr resulting from the extruded resin portion 17C can be minimized. Even if a burr is formed, the height thereof can be reduced. By using the nano-imprint mold 1a according to this embodiment, an adverse effect caused by a burr formed in transferring a pattern to the resin portion 17 can be minimized.

Furthermore, in the nano-imprint mold 1a according to this embodiment, the interior angle 5θ between each side surface 5R and the first surface 5S1 of the mold body 5 is preferably larger than or equal to 40 degrees but smaller than 90 degrees. It is more preferable that the interior angle 5θ between each side surface 5R and the first surface 5S1 of the mold body 5 ranges between 75 degrees and 80 degrees. When the interior angle 5θ is smaller than 90 degrees, more preferably, 80 degrees or smaller, the extruded resin portion 17C can be sufficiently prevented from reaching the non-fixation surface 3SE of the mold base 3 via the side surfaces 5R of the mold body 5 at pressing the first surface 5S1 of the mold body 5 against the resin portion 17. As a result, an adverse effect caused by a burr formed in transferring a pattern to the resin portion 17 can be further minimized.

When the interior angle 5θ is 40 degrees or larger, more preferably, 75 degrees or larger, the strength of each corner 5C that defines the interior angle 5θ of the mold body 5 can be sufficiently increased.

Furthermore, in the nano-imprint mold 1a according to this embodiment, the first surface 5S1 and the side surfaces 5R of the mold body 5 are provided with the hydrophobic film 6 for improving the wetting characteristics of its surface of the mold body 5 with respect to resin (UV curing resin) used for the nano-imprint process. This hydrophobic film 6 is composed of hexamethyldisilazane (HMDS). When the first surface 5S1 of the mold body 5 is pressed against the resin portion 17, the extruded resin portion 17C is less movable along the side surfaces 5R of the mold body 5 toward the surface 3S of the mold base 3 since the hydrophobic film 6 is formed. Therefore, the extruded resin portion 17C can be prevented from reaching the non-fixation surface 3SE of the mold base 3. As a result, an adverse effect caused by a burr formed in transferring a pattern to the resin portion 17 can be further minimized.

With the resin-pattern forming method according to the above-described embodiment, since the above-described nano-imprint mold 1a is used, the occurrence of a burr resulting from the extruded resin portion 17C can be minimized. In addition, even if a burr is formed, the height thereof can be reduced. As a result, an adverse effect caused by a burr formed in transferring a pattern to the resin portion 17 can be minimized.

Second Embodiment

Next, a nano-imprint mold 1b according to a second embodiment will be described. In the nano-imprint mold 1b according to this embodiment, the shape of the mold base is different from the shape of the mold base in the first embodiment.

Figure 17:
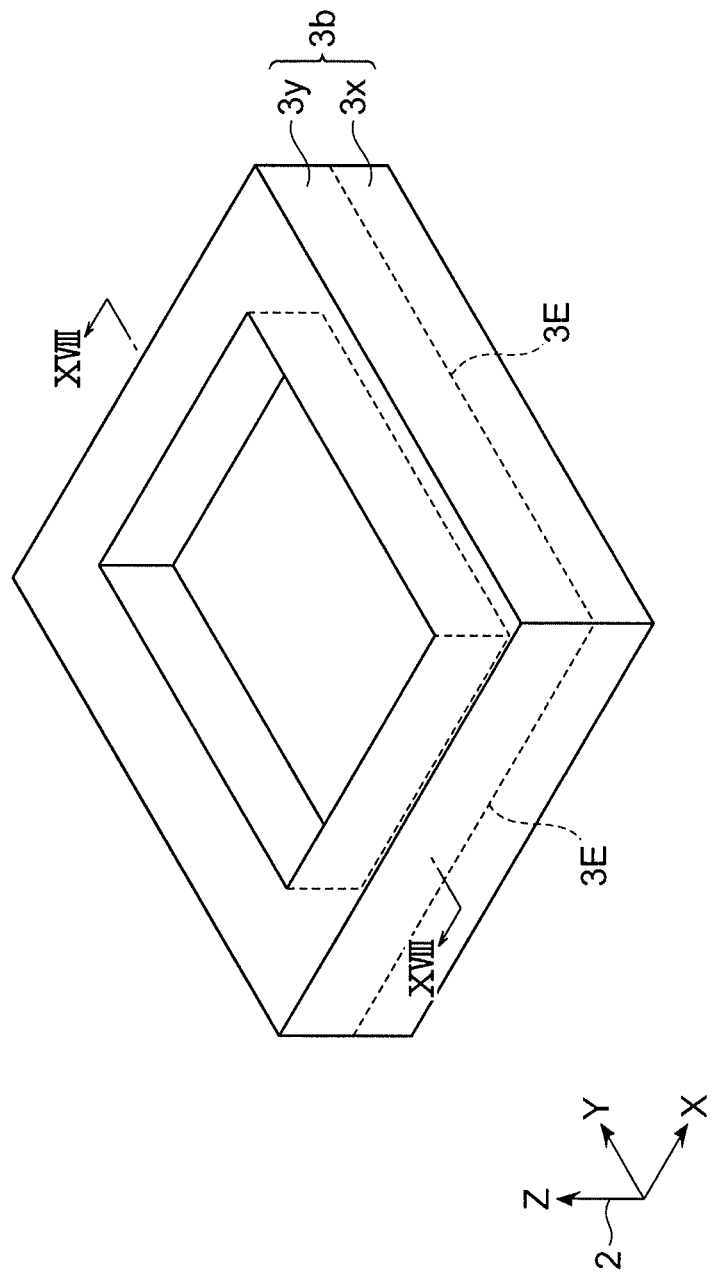
FIG. 17 is a perspective view of a mold base for explaining a mold-base preparation step in a second embodiment.
Figure 18:
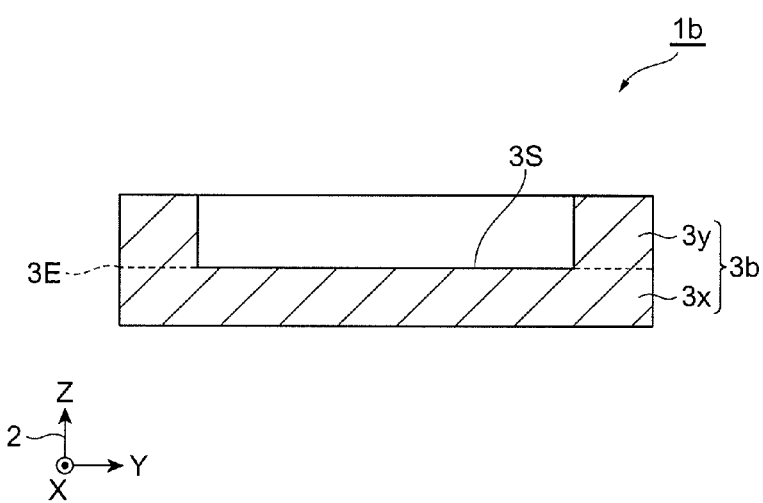
FIG. 18 is a cross-sectional view of the mold base taken along line XVIII-XVIII in FIG. 17.

FIG. 17 is a perspective view of a mold base in this embodiment. FIG. 18 is a cross-sectional view of the mold base taken along line XVIII-XVIII in FIG. 17.

As shown in FIGS. 17 and 18, in this embodiment, a mold base 3b has a first base section 3x and a second base section 3y.

The first base section 3x has the same configuration as the mold base 3 (see FIG. 3) in the first embodiment.

The second base section 3y is provided on a part of a surface 3S of the first base section 3x so as to extend along edges 3E of the surface 3S of the first base section 3x. In this embodiment, the second base section 3y is provided entirely along the edges 3E of the surface 3S, such that the first base section 3x and the second base section 3y define a recess. Alternatively, the second base section 3y may be provided along a part of the edges 3E of the surface 3S.

The second base section 3y is composed of, for example, a material that can transmit ultraviolet light to be emitted for curing UV curing resin. For example, the second base section 3y is composed of a material with a transmittance of 90% relative to ultraviolet light with a wavelength of 365 nm. For example, the second base section 3y is made of quartz or synthetic quartz.

Regarding the mold base 3b, the first base section 3x and the second base section 3y may be integrated with each other. In that case, the mold base 3b can be fabricated by, for example, cutting a plate-like substrate into a predetermined shape by using a cutter such as a dicing cutter and a dicing saw, and then etching a midsection of the surface thereof so as to form the aforementioned recess.

The mold base 3b may alternatively be obtained by fabricating the first base section 3x and the second base section 3y as separate components and then fixing the two base sections to each other.

Figure 19:
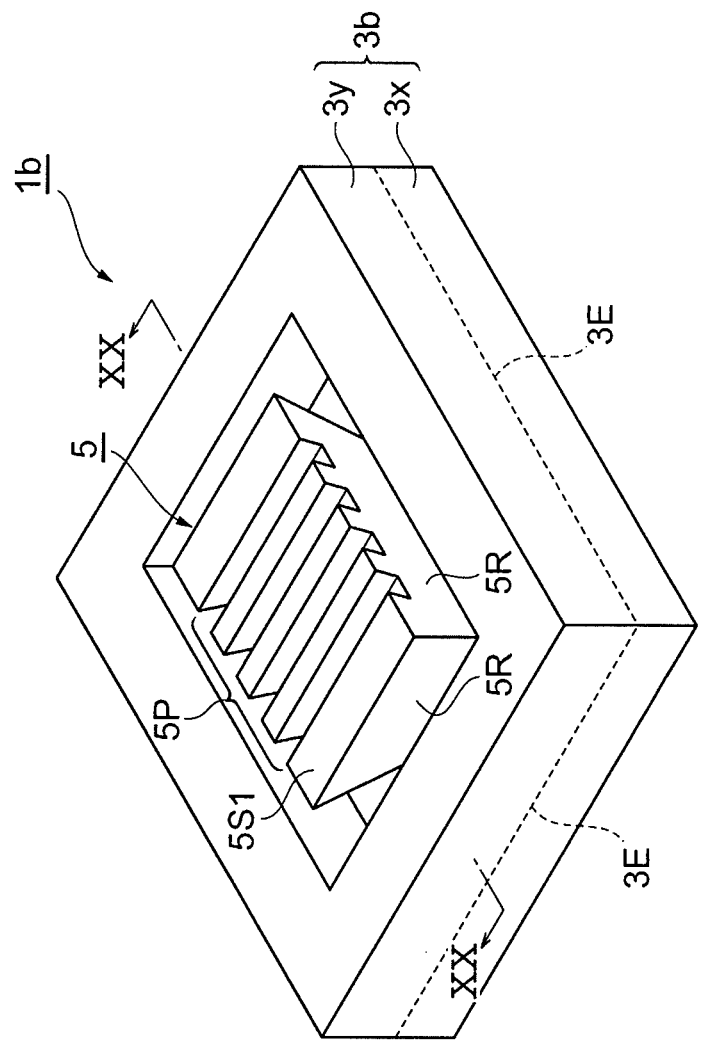
FIG. 19 is a perspective view of a mold for explaining a fixing step in the second embodiment.
Figure 20:
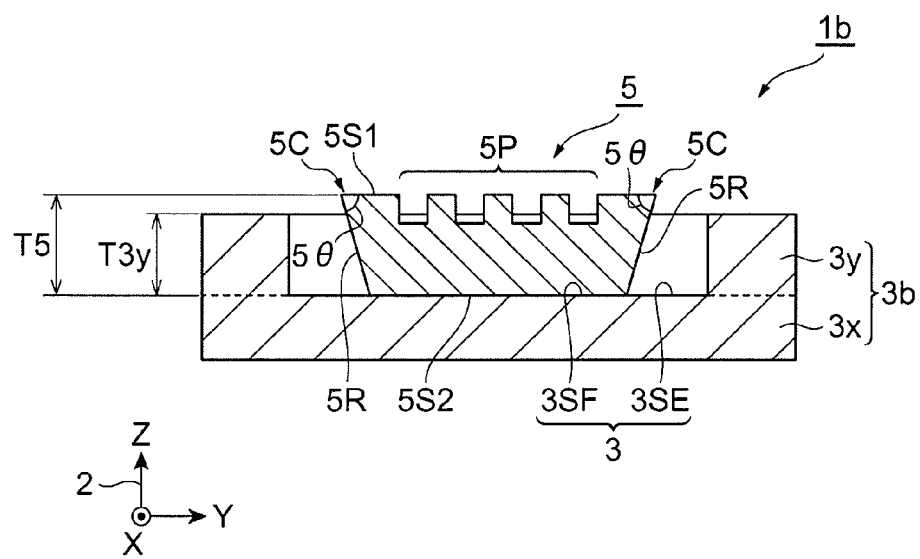
FIG. 20 is a cross-sectional view of the mold taken along line X-X in FIG. 19.

FIG. 19 is a perspective view of the mold 1b according to this embodiment. FIG. 20 is a cross sectional view of the mold 1b taken along line X-X in FIG. 19.

Similar to the first embodiment, the mold 1b according to this embodiment can be formed by, for example, fixing the second surface 5S2 of the mold body 5 to a part of the surface 3S of the mold base 3b by using a fixer, such as an adhesive. The mold body 5 is fixed to a part of the surface 3S of the mold base 3b. In this case, the mold body 5 is disposed within the aforementioned recess defined by the first base section 3x and the second base section 3y. Furthermore, the second base section 3y is disposed away from the mold body 5.

In the mold 1b according to this embodiment, a height T3y of the second base section 3y from the surface 3S of the first base section 3x is smaller than a distance T5 from the surface 3S of the first base section 3x to the first surface 5S1 of the mold body 5.

The nano-imprint mold 1b according to this embodiment used for forming a resin pattern is similar to that in the first embodiment in that the nano-imprint mold 1b can minimize an adverse effect caused by a burr formed in transferring a pattern to the resin portion 17.

Furthermore, in a method for manufacturing the nano-imprint mold 1b according to this embodiment, the height T3y of the second base section 3y from the surface 3S of the first base section 3x is smaller than the distance T5 from the surface 3S of the first base section 3x to the first surface 5S1 of the mold body 5. Therefore, the second base section 3y does not become a hindrance to the pressing of the first surface 5S1 of the mold body 5 against the resin portion 17. Furthermore, the second base section 3y protects the mold body 5 from being damaged by coming into contact with other members.

Principles of the present invention have been described on the basis of preferred embodiments with reference to the drawings. However, those skilled in the art will understand that the embodiments can be changed in terms of details without departing from the principles. Therefore, all the modifications and changes within the scope and the spirit of Claims are claimed as the present invention.

What is claimed is:

1. A nano-imprint mold comprising:
   a mold body having a first surface provided with a pattern having projections and recesses, a second surface opposite the first surface and a side surface between the first surface and the second surface; and
   a mold base having a surface for fixing the mold body thereto, wherein
   the second surface of the mold body is fixed to a part of the surface of the mold base, the second surface being disposed away from at least a part of an edge of the surface of the mold base,
   the mold body has a shape such that a width thereof in a direction orthogonal to a direction extending from the first surface toward the second surface decreases from the first surface toward the second surface, and
   the mold body has an interior angle between the side surface and the first surface that is larger than or equal to 40 degrees and smaller than 90 degrees.

2. The nano-imprint mold according to claim 1, where the interior angle is 75 degrees to 80 degrees.

3. The nano-imprint mold according to claim 1, wherein
   the mold base has a first base section and a second base section that is provided on a part of a surface of the first base section, the second base section extending along at least a part of an edge of the surface of the first base section,
   the surface of the mold base to which the second surface of the mold body is fixed is the surface of the first base section,
   the mold body is disposed away from the second base section, and
   the second base section has a height from the surface of the first base section smaller than a distance from the surface of the first base section to the first surface of the mold body.

4. The nano-imprint mold according to claim 3, wherein the second base section is provided entirely along the edge of the surface of the first base section, and the first base section and the second base section define a recess.

5. The nano-imprint mold according to claim 1, further comprising a hydrophobic film on the first surface of the mold body.

6. The nano-imprint mold according to claim 5, wherein the hydrophobic film is composed of hexamethyldisilazane.

7. The nano-imprint mold according to claim 1, further comprising a hydrophobic film on the first surface and the side surface of the mold body.

8. The nano-imprint mold according to claim 1, wherein the mold body and the mold base are composed of an ultraviolet transmissible material.

9. The nano-imprint mold according to claim 1, wherein the pattern in the first surface of the mold body is a diffraction grating pattern having periodic projections and recesses.

* * * * *